United States Patent [19]

Cathey

[11] Patent Number: 5,049,520
[45] Date of Patent: Sep. 17, 1991

[54] METHOD OF PARTIALLY ELIMINATING THE BIRD'S BEAK EFFECT WITHOUT ADDING ANY PROCESS STEPS

[75] Inventor: David A. Cathey, Boise, Id.
[73] Assignee: Micron Technology, Inc., Boise, Id.
[21] Appl. No.: 534,588
[22] Filed: Jun. 6, 1990
[51] Int. Cl.$^5$ ............................................... H01L 21/70
[52] U.S. Cl. ........................................ 437/60; 437/52; 437/69; 437/228; 148/DIG. 117; 148/DIG. 106
[58] Field of Search .............. 437/60, 69, 56, 70, 437/72, 73, 913, 52; 148/DIG. 117

[56] References Cited

U.S. PATENT DOCUMENTS

| 4,044,454 | 8/1977 | Magdo | 437/70 |
| 4,458,406 | 7/1984 | De La Moneda et al. | 437/52 |
| 4,466,177 | 8/1984 | Chao | 437/60 |
| 4,743,566 | 5/1986 | Bastiaens et al. | 437/70 |

FOREIGN PATENT DOCUMENTS 8101485  5/1981  World Int. Prop. O. .

Primary Examiner—Brian E. Hearn
Assistant Examiner—Michael Trinh
Attorney, Agent, or Firm—David J. Paul

[57] ABSTRACT

A method of partially eliminating the field oxide bird's beak over a storage cell and slightly enlarging the storage cell active area without adding any process steps is described. A photomask is used during a buried contact etch to reduce the field oxide bird's beak both vertically and horizontally. The storage cell active area is further enlarged during a first polysilicon etch step without adding process steps. At that point, the wafer is completed by existing techniques.

6 Claims, 4 Drawing Sheets

METHOD OF PARTIALLY ELIMINATING THE BIRD'S BEAK EFFECT WITHOUT ADDING ANY PROCESS STEPS

FIELD OF THE INVENTION

This invention relates to fabrication of multilayered semiconductor circuit devices and more particularly to wet/dry etch techniques. The method is directed to increasing storage cell capacity by etching away some of the field oxide bird's beak at the same time a buried contact wet etch is being performed and additionally slightly etching (trenching) a storage cell active area during a polysilicon dry etch.

BACKGROUND OF THE INVENTION

This invention relates to wet/dry etch techniques used during the process steps used in the manufacture of multilayered semiconductor circuit devices. During these process steps, it is desired to reduce field oxide bird's beak effect in active capacitor storage cells (referred to as "storage cells" in this disclosure) and to slightly trench the storage cell active area during a subsequent polysilicon etch.

Wet/dry etch refers to process steps in which selected areas on a silicon wafer are exposed by way of photolithography (photomasking) in order to remove (etch) the desired portion of these selected areas during the etching process. Wet etching uses acid chemical compounds in the liquid state, while dry etching use acid chemical compounds in the gaseous state. For example, preforming a wet etch step desired to remove an exposed nitride strip, a liquid made up of hot phosphoric acid is used to dissolve the nitride. As for the dry etch step, an exposed portion of polysilicon can be removed when presented with gaseous hydrofluoric acid.

The cause of field oxide bird's beak effect (bird's beak) initiates from process steps used to isolate an active area location of a storage cell. The Local Oxidation Of Silicon (LOCOS) process, a method commonly used to isolate storage cells in a memory array during the production of a semiconductor device (LSI, VLSI, etc.), constitutes the use of thick field oxide.

Initially, the silicon wafer is prepared using conventional process steps followed by growing a thin layer of initial oxide, usually silicon dioxide, over the wafer surface. Next, a layer of nitride is deposited on the wafer which is then patterned and etched away from all areas except those defined as storage cells. Field oxide is then grown over the areas that were not previously covered with nitride and as it grows it begins to encroach under the edge of the nitride layer.

This oxide encroachment under the nitride is known as bird's beak that results in the actual area of the storage cell being reduced after field oxidation is complete. Therefore, reducing bird's beak becomes a critical factor in increasing the capacitance of a storage cell by maximizing the cell's active area.

The invention relates to a technique to maximize storage cell active area in a high density/high volume semiconductor device fabrication process, such as for DRAMs (dynamic random access memories), by partially eliminating bird's beak without adding any process steps. The invention is applicable to all high density DRAM planar processes from the 16 Kbit to the 16 Megabit generations and beyond.

It is well known for high density DRAM process/cell design, that maximum storage cell active area must be obtained as a percentage of repeating geometry area in a DRAM array. This active region/repeating region ratio determines the overall die size for a given feature size capability. Maximized storage cell active area translates directly into lower cost per bit.

The storage cell active area must be large enough to insure proper sensing of data by the bitline sense amplifiers, to maintain data retention during the period of time before the cell is dynamically refreshed, and to insure strong immunity to single event upsets such as alpha particles.

As geometries shrink in more advanced generation DRAMs, bird's beak becomes a dominant limiting factor to the number of cells that can effectively be packed into a given die.

SUMMARY OF THE INVENTION

An object of this invention is to provide a method of enlarging the active area of a storage cell both vertically and horizontally using wet/dry etching techniques during the fabrication of semiconductor devices.

Another object of this invention is to perform the above mentioned etching techniques without increasing the number of process steps required. In particular it is desired to preform a wet etch to enlarge the storage cell active area at the same time a buried contact is being etched and to additionally slightly trench the storage cell active area during a first polysilicon (poly1) dry etch.

Still another object of this invention is to provide better reliability in terms of less soft errors, longer dynamic refresh periods, and stronger signal strength.

These and other objects of the present invention are attained by providing a method of etching the storage cell isotropically during the buried contact etch which will also allow the storage cell active area to be slightly trenched during the poly1 etch.

During the buried contact etch, a special photomask is used which provides an opening over the storage cell. Because the buried contact etch is a wet etch, the oxide will be etched primarily in the lateral direction but will also etch in the vertical direction. Both lateral and vertical etching results in removinq much of the field oxide which grew under the previously deposited nitride. The end result provides a larger active area for the storage cell.

Following the normal buried contact etch, poly1 is deposited and then oxide is formed (for example by TEOS deposition) over poly1. Continuing the photo-/etch process, the oxide and poly1 are etched respectively. At this point, since the initial oxide deposited over the storage cell active area was removed during the buried contact wet etch, the dry poly1 etch will not only remove the exposed poly1 but also continue to etch into the storage cell active area.

In the preferred embodiment, the poly1 etch uses a 25% overetch to make sure there is no residual poly left on the wafer. For example, if 5,300 angstroms of poly1 is etched, then a 25% overetch will result in an additional 1,300 angstroms of poly substrate being etched in the storage cell. The etch pattern will reflect the slope of the field oxide causing the storage cell to take on more of a dish shaped trenched appearance rather than planar and results in maximized storage cell active area.

After conventional process steps used to implant transistors and storage cells are completed, the bare silicon at the storage cell is eventually covered with a second gate consisting of nitride and oxide to insulate the storage cell during poly2 deposition. The wafer is then completed by conventional methods.

BRIEF DESCRIPTION OF THE DRAWINGS

The drawing Figures each show a portion of a semiconductor circuit device during the fabrication process, which utilizes the present invention.

The cross-sectional view of FIG. 1a shows the initial length of the proposed storage cell;

Figure 1A:
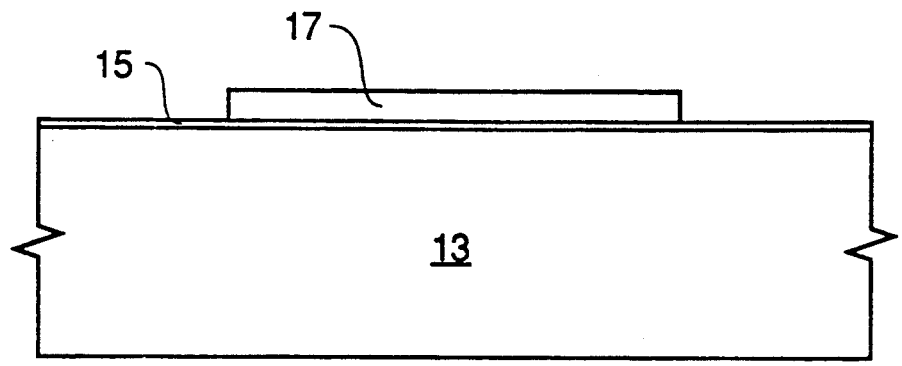
Figure 1B:
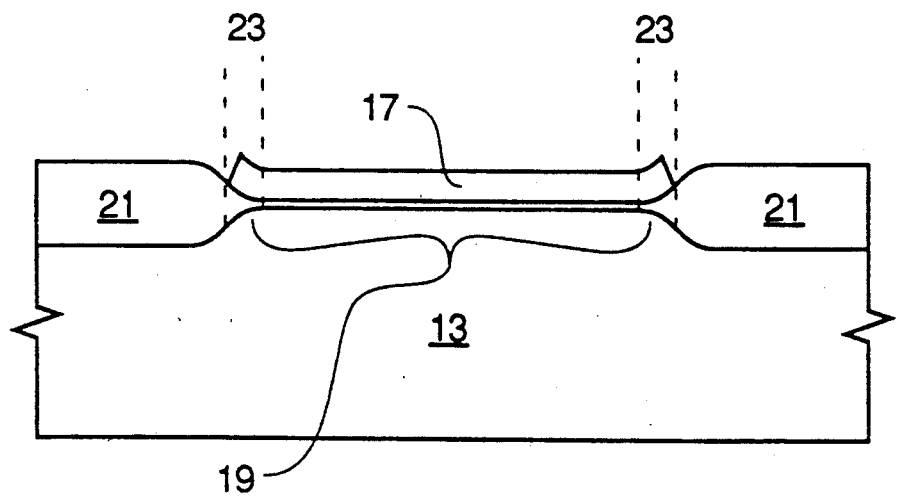
Figure 2:
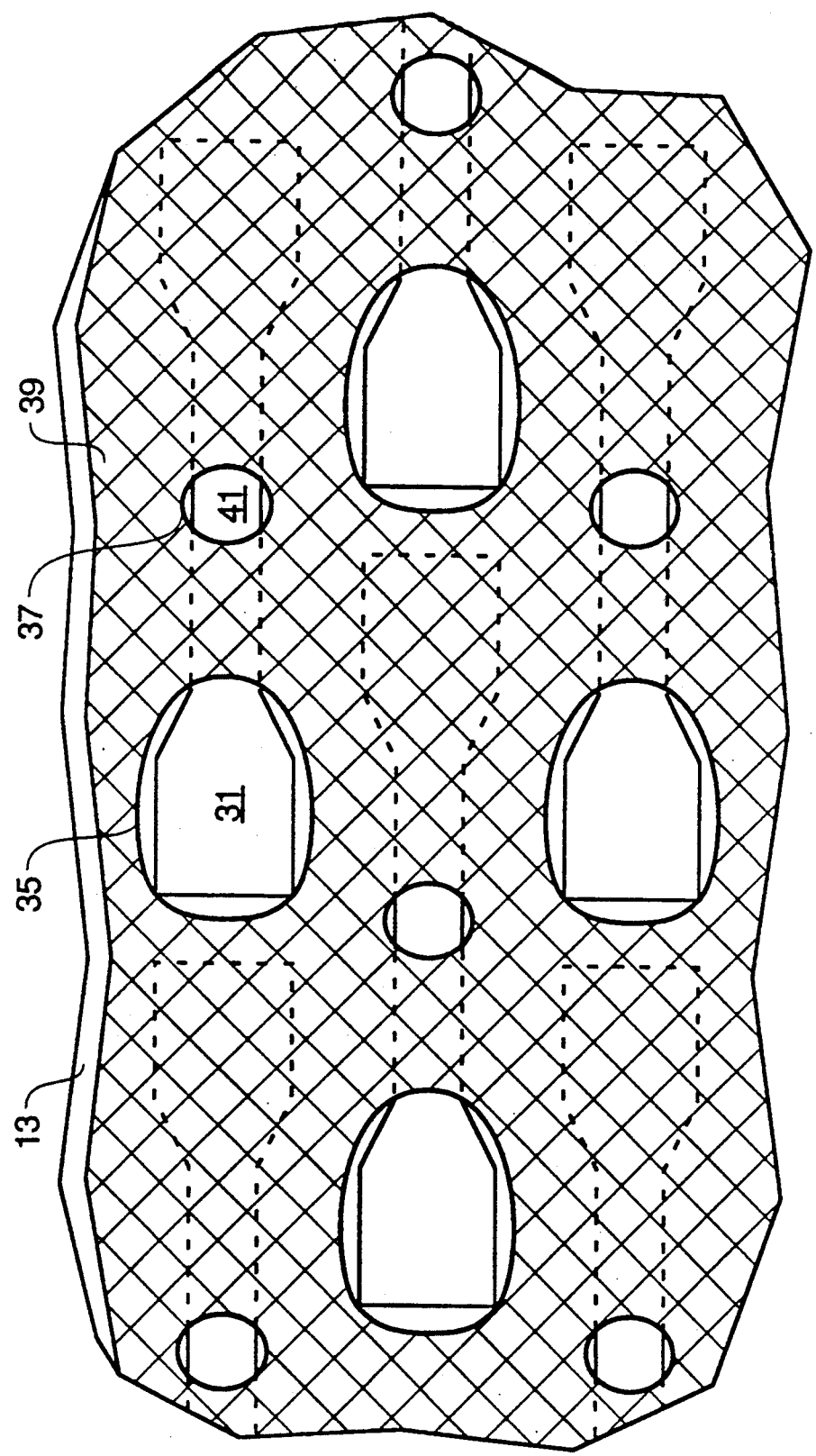
Figure 3A:
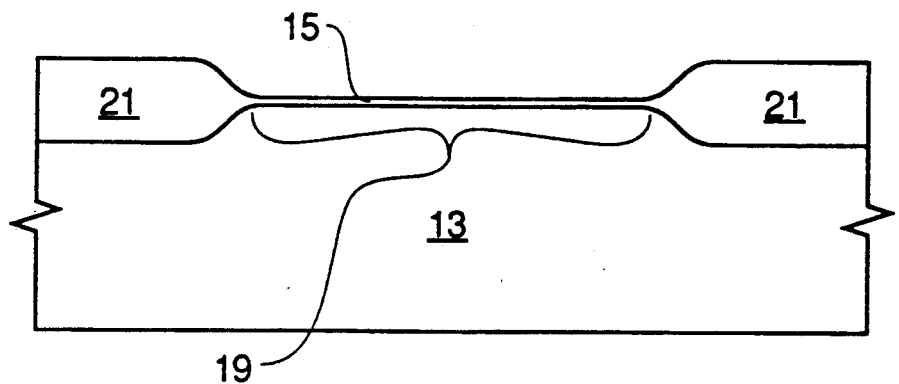
Figure 3B:
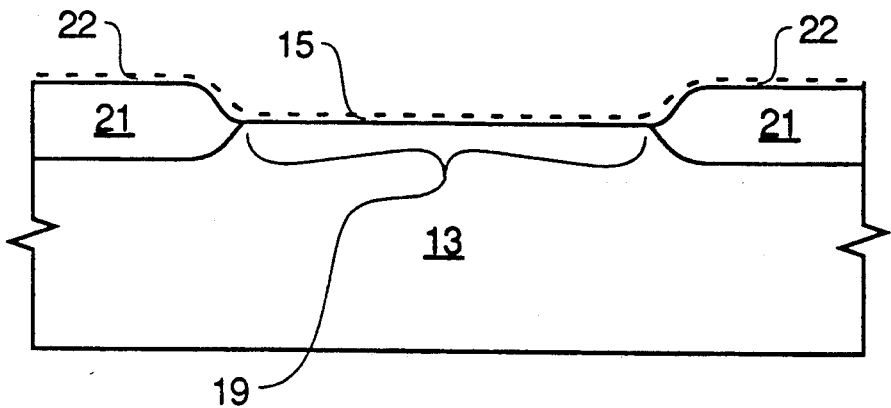
Figure 4:
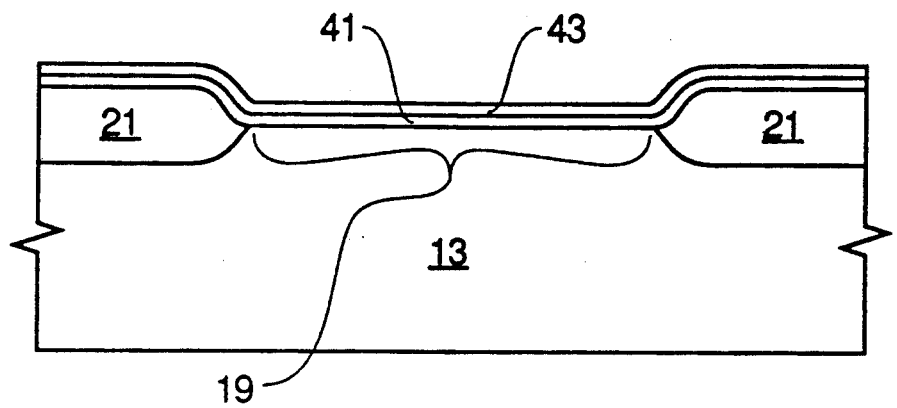
Figure 5:
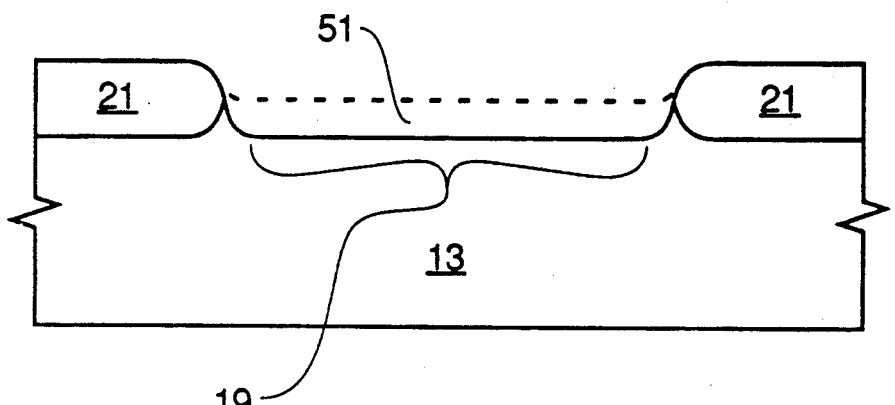
Figure 6:
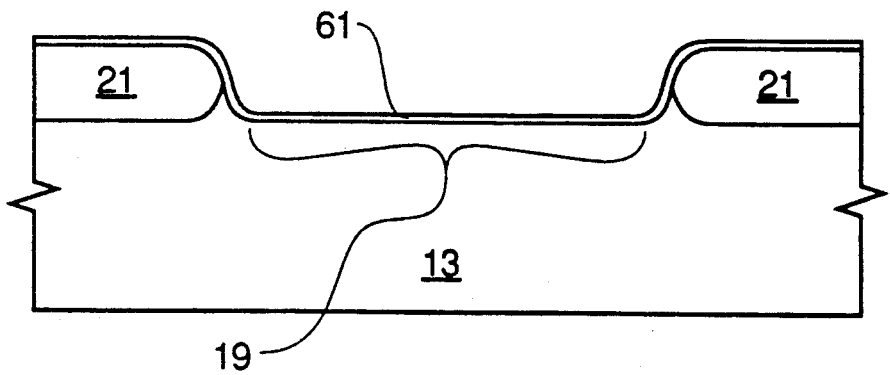

The cross-sectional view of FIG. 1b shows the difference between the original length and the reduced actual length of the storage cell after field oxidation;

The top view of FIG. 2 shows the location of the storage cell active area, the buried contact, and the opening in the photomask necessary for the present invention;

The cross-sectional view of FIG. 3a shows the storage cell before the buried contact etch has been preformed;

The cross-sectional view of FIG. 3b shows both the horizontal and the vertical distance gained by partially reducing bird's beak at the storage cell after preforming the buried contact wet etch;

The cross-sectional view of FIG. 4 shows the storage cell after poly1 and oxide deposition;

The cross-sectional view of FIG. 5 shows the vertical dish shaped distance gained resulting in a slightly trenched storage cell after post poly1 overetch; and The cross-sectional view of FIG. 6 shows the storage cell after it has been insulated with a thin layer of nitride and oxide.

DETAILED DESCRIPTION OF THE PREFERRED EMBODIMENT

This invention is directed to a technique to maximize storage cell active area in a high density/high volume DRAM (dynamic random access memory) fabrication process in a sequence shown in FIGS. 1-6. These Figures show a representative device in the memory array of a dynamic random access memory (DRAM) chip.

FIG. 1a shows a cross-section of a semiconductor circuit during its fabrication. A silicon starting wafer is first prepared for fabrication of semiconductor circuits, including the formation of a thin layer of oxide, known as initial oxide 15. After the formation of initial oxide 15, a dielectric such as nitride 17 is deposited over the thin oxide. The nitride 17 is then masked and etched in order to define active areas.

After the field implant, a thick layer of silicon oxide, such as silicon dioxide, is grown onto the wafer 13 to form field oxide 21, as shown in FIG. 1b. The growth of silicon oxide occurs in areas which are not covered by the nitride layer 17, but tends to encroach under the edge of the nitride layer 17. The encroachment is present around the edges of the nitride 17, as indicated by dashed lines 23, where the field oxide 21 begins to "buck up" or lift (bird's beak effect) the nitride 17.

Now that the silicon oxide has been grown onto the wafer all remaining nitride 17 is removed by such means as using hot phosphoric acid and water. Next, photomasking steps required in order to place buried contacts are carried out. Conventional processes use a photomask that defines the buried contacts only and consequently does not address any bird's beak reduction of the encroaching field oxide at the storage cell.

It is at this point in which the applicant's inventive features come into play. During this process step a wet etch, normally using hydrofluoric acid (HF) is performed that is selective to silicon. This results in the etching away of any field oxide 21 corresponding to the photomask openings needed to locate any buried contacts required. Even though some etching occurs vertically, this etch step is directed primarily to horizontal etching of field oxide 21 until all exposed oxide is removed and the etch is blocked once silicon is reached.

The disclosed invention however, uses the above mentioned wet etch to reduce bird's beak at the storage cell by adding an additional photomask opening 35 over the storage cell active area 31, as show in FIG. 2.

A top view section of the wafer 13 covered by photomask 39 is shown that includes a buried contact mask opening 37 along with the addition of a storage cell mask opening 31. Using this new mask allows the subsequent wet etch to remove not only the field oxide over the area defined for the buried contact 41 but also a portion of field oxide adjacent to the storage cell active area 31 and the initial oxide covering the storage cell.

FIG. 3a shows the stage the storage cell will be in before the buried contact wet etch is performed. As shown in FIG. 3a, the profile of the active area 19 is covered by the two components of oxide, the field oxide 21 and the initial oxide 15. Because photomask 39 has the additional opening over the storage cell, a portion of the field oxide 21 along with all of the initial oxide 15 will be removed during the buried contact wet etch that follows.

As shown in FIG. 3b, the area of field oxide 22 is the portion of field oxide 21 that the buried contact wet etch removes along the thin layer of initial oxide 15. The area of field oxide 22 is the portion of the bird's beak removed during the buried con&act wet etch. The removal of initial oxide 15 fully exposes the underlying silicon in order to prepare for the polysilicon deposition.

Following the buried contact etch, polysilicon (poly1) 41 is deposited over the wafer followed by the deposition of oxide layer 43 as shown in FIG. 4. In the preferred embodiment, low pressure chemical vapor deposition (LPCVD) is used to deposit silicon dioxide TEOS oxide or TEOS) over poly1 41 to form oxide layer 43.

Following the process steps necessary for TEOS deposition, all transistors are patterned and dry etched normally using two steps. First the oxide is patterned and etched to define a gate for each desired transistor and then the oxide remaining over the transistor gate is used as a mask during the removal of the poly1. Again the advantage of having the additional photomask opening over the storage cell during the buried contact etch comes into play. Because all exposed oxide was removed during the buried contact etch the thin layer of initial oxide normally present over the storage cell is gone, thus allowing the dry poly1 etch to continue etching into the storage cell active area as the desired poly1 is being removed. This etch is primarily directed to the vertical etching of the polysilicon in the storage cell region, however horizontal etching also occurs along the width of the trench that is being cut.

As shown in FIG. 5, the dish shaped portion 51 of the active area 19 shows the additional vertical distance gained in the storage cell during the poly1 overetch. As can be seen the storage cell has not taken on a trench shape giving the storage cell even more surface area.

Next, conventional process steps are taken to deposit a thin layer of nitride over the storage cell to form the dielectric, followed by growing oxide over the wafer. This nitride/oxide layer is shown in FIG. 6, by a second gate layer 61 consisting of nitride/oxide covering the field oxide 21 and the active area 19 of the storage cell.

The top plate of the storage cell is formed by a second polysilicon (poly2) deposition and the wafer is then completed by normal process steps.

While the invention is described in terms of DRAMs, this is merely the preferred embodiment for which the inventive techniques were developed. This method of partially reducing bird's beak is also applicable to related semiconductor circuit devices, including video random access memories (VRAMs) and other multiport RAMs.

I claim:

1. A method of enlarging storage cell active areas in semiconductor circuit devices on a wafer surface, the method comprising:
   a) depositing a first oxide layer superjacent the wafer surface;
   b) depositing a dielectric layer superjacent said first oxide layer and patterning said dielectric layer thereby defining locations for said active areas;
   c) growing field oxide on said first oxide layer not covered by said patterned dielectric layer, growing of said field oxide encroaches under the edges of said patterned dielectric thereby forming field oxide bird's beak;
   d) applying a photomask to said wafer surface, said photomask having a first opening to expose an area to define a buried contact location and a second opening to expose said storage cell active areas;
   e) performing a first etching step thereby etching said patterned dielectric and a horizontal portion of said field oxide, said first etching step thereby reducing said field oxide bird's beak primarily in the horizontal direction;
   f) removing said photomask;
   g) depositing a polysilicon layer superjacent said wafer surface;
   h) depositing a second oxide layer superjacent said polysilicon layer; and
   i) performing a second etching step thereby etching said second oxide layer and said polysilicon layer to form trenches into said storage cell active areas thereby enlarging said storage cell active areas primarily in the vertical direction.

2. An enlarging method as recited in claim 1, further characterized by:
   said dielectric being a layer of nitride.

3. An enlarging method as recited in claim 1, further characterized by:
   said vertical enlargement of said storage cell active area requires using said photomask having said second opening over the storage cell active area during said first etching step.

4. A method of enlarging storage cell active areas in random access memory devices fabricated on a wafer surface, the method comprising:
   a) depositing a first oxide layer superjacent the wafer surface;
   b) depositing a dielectric layer superjacent said first oxide layer and patterning said dielectric layer thereby defining locations for said active areas;
   c) growing field oxide on said first oxide layer not covered by said patterned dielectric layer, growing of said field oxide encroaches under the edges of said patterned dielectric thereby forming field oxide bird's beak;
   d) applying a photomask to said wafer surface, said photomask having a first opening to expose an area to define a buried contact location and a second opening to expose said storage cell active areas;
   e) performing a first etching step thereby etching said patterned dielectric and a horizontal portion of said field oxide, said first etching step thereby reducing said field oxide bird's beak primarily in the horizontal direction;
   f) removing said photomask;
   g) depositing a polysilicon layer superjacent said wafer surface;
   h) depositing a second oxide layer superjacent said polysilicon layer; and
   i) performing a second step thereby etching said second oxide layer and said polysilicon layer to form trenches into said storage cell active areas thereby enlarging said storage cell active areas primarily in the vertical direction.

5. An enlarging method as recited in claim 4, further characterized by:
   said dielectric being a layer of nitride.

6. An enlarging method as recited in claim 4, further characterized by:
   said vertical enlargement of said storage cell active area requires using said photomask having said second opening over the storage cell active area during said first etching step.

* * * * *

UNITED STATES PATENT AND TRADEMARK OFFICE
CERTIFICATE OF CORRECTION

PATENT NO. : 5,049,520
DATED : September 17, 1991
INVENTOR(S) : David A. Cathey

It is certified that error appears in the above-indentified patent and that said Letters Patent is hereby corrected as shown below:

Column 3, line 19, delete "preformed" and insert -- performed --;

Column 3, line 23, delete "preforming" and insert -- performing --;

Column 4, line 12, delete "show" and insert -- shown --;

Column 4, line 34, delete "con&act" and insert -- contact --;

Column 4, line 65, delete "not" and insert -- now --;

Signed and Sealed this

Twenty-sixth Day of October, 1993

Attest:

BRUCE LEHMAN

Attesting Officer

Commissioner of Patents and Trademarks